US010804095B2

(12) United States Patent
Bae et al.

(10) Patent No.: US 10,804,095 B2
(45) Date of Patent: Oct. 13, 2020

(54) COMPOSITION FOR FORMING SILICA LAYER, SILICA LAYER, AND ELECTRONIC DEVICE

(71) Applicant: Samsung SDI Co., Ltd., Yongin-si (KR)

(72) Inventors: Jin-Hee Bae, Suwon-si (KR); Taeksoo Kwak, Suwon-si (KR); Byeonggyu Hwang, Suwon-si (KR); Kunbae Noh, Suwon-si (KR); Jun Sakong, Suwon-si (KR); Jinwoo Seo, Suwon-si (KR); Junyoung Jang, Suwon-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 66 days.

(21) Appl. No.: 16/163,170

(22) Filed: Oct. 17, 2018

(65) Prior Publication Data

US 2019/0189430 A1  Jun. 20, 2019

(30) Foreign Application Priority Data

Dec. 14, 2017  (KR) ........................ 10-2017-0172379

(51) Int. Cl.
*H01L 21/02* (2006.01)
*C01B 21/068* (2006.01)
(Continued)

(52) U.S. Cl.
CPC ...... *H01L 21/02164* (2013.01); *C01B 21/068* (2013.01); *C09D 183/16* (2013.01); (Continued)

(58) Field of Classification Search
CPC ......... H01L 21/02164; H01L 21/02214; H01L 21/02216; H01L 21/02222; H01L 21/02282
See application file for complete search history.

(56) References Cited

U.S. PATENT DOCUMENTS

| 8,822,034 B2 * | 9/2014 | Kamizono | ............. | C09D 11/38 |
| | | | | 106/311 |
| 2002/0113241 A1 * | 8/2002 | Kubota | ................. | H05B 33/04 |
| | | | | 257/79 |

(Continued)

FOREIGN PATENT DOCUMENTS

| CN | 103502318 A | 1/2014 |
| JP | 10-098036 A | 4/1998 |

(Continued)

OTHER PUBLICATIONS

Communication dated Mar. 27, 2020 from the Taiwanese Patent Office in application No. 107139247.

*Primary Examiner* — Jaehwan Oh
(74) *Attorney, Agent, or Firm* — Sughrue Mion, PLLC

(57) ABSTRACT

A composition for forming a silica layer includes a silicon-containing polymer and a solvent, the composition having a $SiO_2$ conversion rate of greater than about 0 and less than or equal to about 15. The $SiO_2$ conversion rate is represented by: $SiO_2$ conversion rate=(a ratio of an area of Si—O to an area of Si—H measured after coating the composition in a thickness of 6700 Å on a bare wafer, and allowing the coated wafer to stand for 24 hours under conditions of a temperature of 85° C. and a relative humidity of 85%)−(a ratio of an area of Si—O to an area of Si—H measured after coating the composition in a thickness of 6700 Å on a bare wafer, and allowing the coated wafer to stand for 2 hours under conditions of a temperature of 85° C. and a relative humidity of 85%).

16 Claims, 2 Drawing Sheets

(51) Int. Cl.
    *C09D 183/16*     (2006.01)
    *C08G 77/62*     (2006.01)

(52) U.S. Cl.
    CPC .. *H01L 21/02214* (2013.01); *H01L 21/02216* (2013.01); *H01L 21/02222* (2013.01); *C08G 77/62* (2013.01); *H01L 21/02282* (2013.01)

(56) References Cited

U.S. PATENT DOCUMENTS

| | | | | |
|---|---|---|---|---|
| 2016/0200939 | A1* | 7/2016 | Cho | C09K 11/621 |
| | | | | 136/257 |
| 2016/0338919 | A1* | 11/2016 | Pan | A61K 8/022 |
| 2017/0096599 | A1* | 4/2017 | Han | C09K 11/565 |
| 2019/0256410 | A1* | 8/2019 | Isshiki | C03C 15/00 |

FOREIGN PATENT DOCUMENTS

| | | |
|---|---|---|
| JP | 3919862 B2 | 5/2007 |
| JP | 2008-088224 A | 4/2008 |
| JP | WO 2015/053055 A1 | 4/2015 |
| JP | 6017256 B2 | 10/2016 |
| JP | 2017-031040 A | 2/2017 |
| JP | 2017-063178 A | 3/2017 |
| JP | 6104785 B2 | 3/2017 |
| KR | 10-1288574 B1 | 7/2013 |
| KR | 10-1583232 B1 | 1/2016 |
| KR | 1020160075147 A | 3/2018 |
| TW | 238325 B | 1/1995 |
| TW | 201807076 A | 3/2018 |

\* cited by examiner

COMPOSITION FOR FORMING SILICA LAYER, SILICA LAYER, AND ELECTRONIC DEVICE

CROSS-REFERENCE TO THE RELATED APPLICATION

This application claims priority from Korean Patent Application No. 10-2017-0172379 filed in the Korean Intellectual Property Office on Dec. 14, 2017, the disclosure of which is incorporated herein in its entirety by reference.

BACKGROUND

1. Field

Compositions, apparatuses and methods consistent with example embodiments relate to a silica layer and an electronic device manufactured according to the same are disclosed.

2. Description of the Related Art

A flat panel display uses a thin film transistor (TFT) including a gate electrode, a source electrode, a drain electrode and a semiconductor as a switching device, and includes a gate line, which transfers a scan signal for controlling the thin film transistor, and a data line which transfers a signal applied to a pixel electrode. In addition, an insulation layer is formed between the semiconductor and the several electrodes to electrically separate them. The insulation layer may be a silica layer including a silicon component.

In general, when a composition including a silicon-containing polymer is coated on a substrate and converted into a silica layer, layer stress may be generated, which may cause cracking during a process of manufacturing a semiconductor, thereby reducing or deteriorating reliability of a device including the silica layer.

SUMMARY

Example embodiments of the inventive concept provide for a composition for forming a silica layer capable of decreasing a shrinkage rate of the silica layer by controlling a conversion rate of a silicon-containing polymer into a silica layer within a predetermined range.

Example embodiments of the inventive concept also provide for a silica layer having improved wet etch rate (WER) characteristics in a pattern (i.e., gap) of a pattern wafer as well as a small rate of layer shrinkage.

Example embodiments of the inventive concept also provide for an electronic device including the silica layer for formed.

According to an aspect of an example embodiment, there is provided a composition for forming a silica layer which may include a silicon-containing polymer and a solvent, wherein the composition has a $SiO_2$ conversion rate of greater than about 0 and less than or equal to about 15.

The $SiO_2$ conversion rate may be represented by:

$SiO_2$ conversion rate=(a ratio of an area of Si—O to an area of Si—H measured after coating the composition in a thickness of 6700 Å on a bare wafer, and allowing the coated wafer to stand for 24 hours under conditions of a temperature of 85° C. and a relative humidity of 85%)−(a ratio of an area of Si—O to an area of Si—H measured after coating the composition in a thickness of 6700 Å on a bare wafer, and allowing the coated wafer to stand for 2 hours under conditions of a temperature of 85° C. and a relative humidity of 85%).

The $SiO_2$ conversion rate may be greater than or equal to about 1 and less than or equal to about 15.

The $SiO_2$ conversion rate may be greater than or equal to about 5 and less than or equal to about 15.

The silicon-containing polymer may be polysilazane, polysiloxazane, or a combination thereof.

The silicon-containing polymer may be included in an amount of about 0.1 wt % to about 30 wt % based on a total amount of the composition for forming a silica layer.

According to an aspect of an example embodiment, there is provided a silica layer which may include a silica component obtained by curing the composition for forming a silica layer.

The shrinkage rate of the silica layer may range from about 13% to about 15.5%.

The shrinkage rate may be represented by:

Layer shrinkage rate (%)=(layer thickness before wet curing−layer thickness after wet curing)/(layer thickness before wet curing)×100%

To measure the layer shrinkage rate, the wet curing may be performed through heat treatment at 600° C. for 30 minutes.

According to an aspect of an example embodiment, there is provided an electronic device which may include the silica layer so formed.

The silica layer according to the presented example embodiments has improved wet etch rate (WER) characteristics in a pattern (i.e., gap) of a pattern wafer as well as a small rate of layer shrinkage.

BRIEF DESCRIPTION OF THE DRAWINGS

Various aspects of the inventive concept will become apparent and more readily appreciated from the following description of the example embodiments, taken in conjunction with the accompanying drawings, in which.

DETAILED DESCRIPTION

Figure 1:
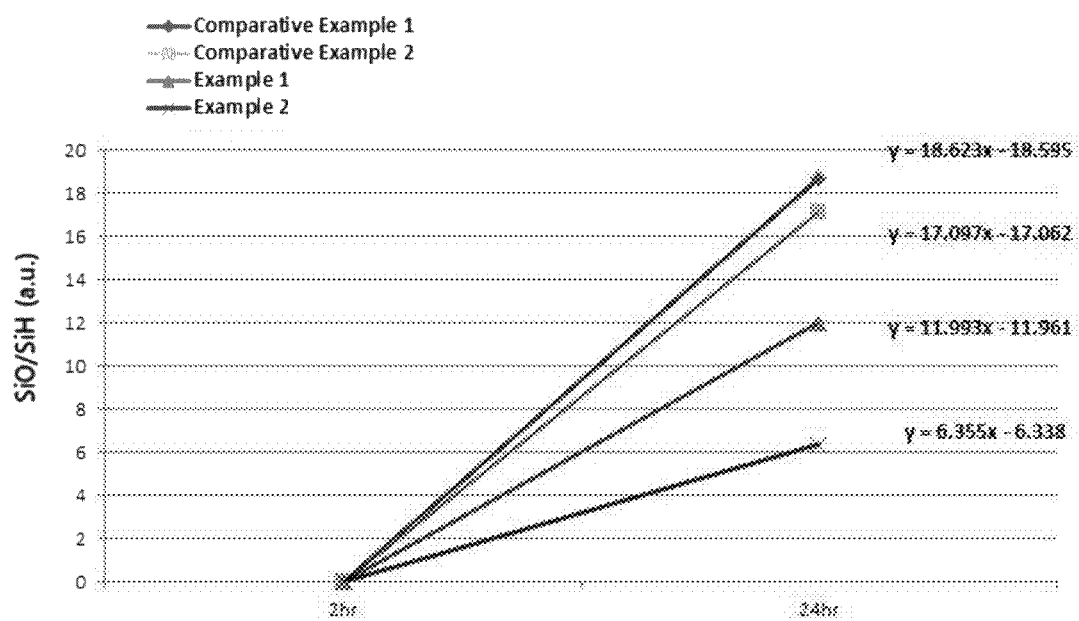
FIG. 1 is a graph showing a Si—O/Si—H area ratio (a relative value) of each composition for forming a silica layer according to Examples 1 and 2 and Comparative Examples 1 and 2.

Example embodiments of the inventive concept will be described in detail in reference to the accompanying drawings. However, the inventive concept may be embodied in many different forms and is not construed as limited to the example embodiments set forth herein.

As used herein, when a definition is not otherwise provided, the term 'substituted' refers to replacement of at least one hydrogen atom forming a compound by a substituent selected from a halogen atom (F, Br, Cl, or I), a hydroxy group, an alkoxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, a phosphoric acid or a salt thereof, a C1 to C20 alkyl group, a C2 to C20 alkenyl group, a C2 to C20 alkynyl group, a C6 to C30 aryl group, a C7 to C30 arylalkyl group, a C1 to C30 alkoxy group, a C1 to C20 heteroalkyl group, a C2 to C20 heteroaryl group, a C3 to C20 heteroarylalkyl group, a C3 to C30 cycloalkyl group, a C3 to C15 cycloalkenyl group, a C6 to C15 cycloalkynyl group, a C2 to C30 heterocycloalkyl group, and a combination thereof.

As used herein, when a definition is not otherwise provided, the term 'hetero' refers to an item including 1 to 3 heteroatoms selected from N, O, S, and P.

In addition, unless noted otherwise, the mark "*" as used herein refers to something that is connected with the same or different atom or chemical formula.

As used herein, expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

Hereinafter, a composition for forming a silica layer according to an example embodiment is described.

A composition for forming a silica layer according to an example embodiment includes a silicon-containing polymer and a solvent, and a SiO$_2$ conversion rate of the composition is greater than about 0 and less than or equal to about 15.

The SiO$_2$ conversion rate is calculated by a following Equation 1:

SiO$_2$ conversion rate=(a ratio of an area of Si—O to an area of Si—H measured after coating the composition for forming a silica layer in a thickness of 6700 Å on a bare wafer, and allowing the coated wafer to stand for 24 hours under conditions of a temperature of 85° C. and a relative humidity of 85%)−(a ratio of an area of Si—O to an area of Si—H measured after coating the composition for forming a silica layer in a thickness of 6700 Å on a bare wafer, and allowing the coated wafer to stand for 2 hours under conditions of a temperature of 85° C. and a relative humidity of 85%). [Equation 1]

The SiO$_2$ conversion rate refers to a degree of conversion of a silicon-containing polymer into a silica layer. According to an example embodiment, the area ratio of Si—O to Si—H is measured by using Fourier-transform infrared (FT-IR) spectroscopy, and the measured area ratio is digitized into a slope value based on the amount of time that the silica layer is allowed to stand under a given condition. This slope value may be used to calculate a rate of conversion of the silicon-containing polymer into a silica layer (SiO$_2$).

Herein, the area of Si—O and the area of Si—H refer to areas under certain wavelengths in an FT-IR spectrum related to Si—O and Si—H, respectively, when the FT-IR spectrum is measured under the above-described conditions. These wavelengths of an FT-IR spectrum relating to Si—O are 1000-1300 cm$^{-1}$, and the wavelengths of an FT-IR spectrum relating to Si—H are 2100-2285 cm$^{-1}$.

In general, when a composition including a silicon-containing polymer is coated onto a substrate and converted into a silica layer, the layer may shrink as a result of a difference in thermal expansion coefficients between the substrate and the composition. This layer shrinkage rate may cause cracks to be formed during a semiconductor-manufacturing process, thereby reducing or deteriorating reliability of a device including the silica layer.

The composition for forming a silica layer according to the current example embodiment may provide for a silica layer having excellent wet etch rate (WER) characteristics inside a pattern (i.e., gap) of a pattern wafer, as well as a small rate of layer shrinkage rate by limiting a SiO$_2$ conversion rate to a range of greater than about 0 and less than or equal to about 15. According to an example embodiment, the SiO$_2$ conversion rate may be in a range of greater than or equal to about 1 and less than or equal to about 15, greater than or equal to about 5 and less than or equal to about 15, greater than or equal to about 6 and less than or equal to about 15, greater than or equal to about 6 and less than or equal to about 13, or greater than or equal to about 6 and less than or equal to about 12, but the inventive concept is not limited thereto.

The silicon-containing polymer included in the composition for forming a silica layer may be, for example, polysilazane (an organic-inorganic polysilazane), polysiloxazane (an organic-inorganic polysiloxazane), or a combination thereof.

The silicon-containing polymer may include, for example, a moiety represented by Chemical Formula 1 below.

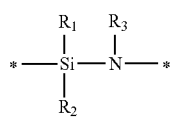

[Chemical Formula 1]

In above Chemical Formula 1, each of R$_1$ to R$_3$ is independently hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C2 to C30 alkenyl group, a substituted or unsubstituted alkoxy group, a carboxyl group, an aldehyde group, a hydroxy group, or a combination thereof, and "*" indicates a linking point.

For example, the silicon-containing polymer may be polysilazane prepared by reacting a halosilane with ammonia.

For example, the silicon-containing polymer included in the composition for forming a silica layer may include a moiety represented by Chemical Formula 2 below.

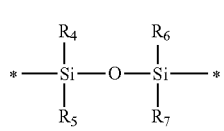

[Chemical Formula 2]

In above Chemical Formula 2, each of R$_4$ to R$_7$ is independently hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C2 to C30 alkenyl group, a substituted or unsubstituted alkoxy group, a carboxyl group, an aldehyde group, a hydroxy group, or a combination thereof. Here, "*" indicates a linking point.

For example, the silicon-containing polymer may include the moiety represented by Chemical above Formula 1 and/or the moiety represented by Chemical above Formula 2, and may further include a moiety represented by Chemical Formula 3 below.

*—SiH$_3$ [Chemical Formula 3]

The moiety represented by above Chemical Formula 3 is a structure in which a terminal end is capped with hydrogen, and may be included in an amount of from about 15 to about 35 wt % based on a total amount of the Si—H bond in the above polysilazane or polysiloxazane structure. When the moiety of above Chemical Formula 3 is included in the polysilazane or polysiloxazane structure within the above range, a SiH$_3$ moiety is prevented from being scattered into SiH$_4$ during the oxidation reaction that occurs during a heat treatment, and thus, a crack in a filler pattern may be prevented.

For example, the silicon-containing polymer may be included in an amount of from about 0.1 wt % to about 30 wt % based on a total amount of the composition for forming a silica layer.

The composition for forming a silica layer may include a solvent. The solvent used in the composition for forming a silica layer may be any solvent in which the silicon-containing polymer is soluble without limitation, and may include, for example, at least one selected from benzene, toluene, xylene, ethylbenzene, diethylbenzene, trimethylbenzene, triethylbenzene, cyclohexane, cyclohexene, decahydro naphthalene, dipentene, pentane, hexane, heptane, octane, nonane, decane, ethylcyclohexane, methylcyclohexane, cyclohexane, cyclohexene, p-menthane, dipropylether, dibutylether, anisole, butyl acetate, amyl acetate, methylisobutylketone, and a combination thereof.

According to another example embodiment, a method for manufacturing a silica layer includes coating a composition for forming a silica layer onto a substrate (or a bare wafer), drying the substrate coated with the composition for forming a silica layer, and curing the composition for forming a silica layer.

The composition for forming a silica layer may be coated through a solution process, for example, spin-on coating, slit coating, inkjet printing, and the like.

The substrate may be, for example a device substrate such as a semiconductor, a liquid crystal and the like, but is not limited thereto.

When the composition for forming a silica layer is completely coated on the substrate, the substrate is subsequently dried and cured. The drying and curing may be, for example, performed at a temperature of greater than or equal to about 100° C. under an atmosphere including inert gas by applying energy such as heat, ultraviolet (UV), a microwave, a sound wave, an ultrasonic wave, or the like to the composition.

For example, the drying may be performed at a temperature of about 100° C. to about 200° C., and through the drying, solvent may be removed from the composition for forming a silica layer. In addition, the curing may be performed at a temperature of about 250° C. to about 1,000° C., and as a result of the curing, the composition for forming a silica layer may be converted into a thin oxide film.

According to another example embodiment, a silica layer may include a silica component obtained by curing the composition for forming a silica layer.

The silica layer may be, for example, an insulation layer, a separation layer, a hard coating layer, and the like, but is not limited thereto. A shrinkage rate of the silica layer may be, for example, about 13% to about 15.5%. The shrinkage rate is calculated by Equation 2 below.

Layer shrinkage rate (%)=(layer thickness before wet curing−layer thickness after wet curing)/(layer thickness before wet curing)×100% [Equation 2]

Herein, the wet curing in the layer shrinkage rate refers to heat treatment at a temperature of about 600° C. for about 30 minutes.

An electronic device according to an example embodiment may include the silica layer of the above example embodiments and examples described herein. The electronic device may be, for example a display device such as a liquid-crystal display (LCD) or a light-emitting diode (LED), or a semiconductor device.

The following examples illustrate the embodiments of the inventive concept in more detail. However, these embodiments are only exemplary, and the inventive concept is not limited thereto.

Preparation of Composition for Forming Silica Layer

EXAMPLE 1

A 1 L reactor equipped with a stirrer and a temperature controller was internally charged with dry nitrogen. Subsequently, 800 g of dry pyridine was put in the reactor and was cooled down to −1° C. Then, 60 g of dichlorosilane was slowly injected thereinto over 65 minutes at a rate of 200 sccm. Then, the resultant was aged for 1 hour while being stirred, and 37 g of ammonia was slowly injected thereinto over 4 hours at a rate of 200 sccm. Then, the resultant was aged for 2 hours while being stirred. Dry nitrogen was injected into the reactor for 12 hours, and the ammonia remaining in the reactor was removed. A white slurry product obtained through the foregoing step was filtered with a 0.1 μm Teflon filter under a dry nitrogen atmosphere to obtain 680 g of a filtered solution. Then, 800 g of dry xylene was added thereto, the solid content was adjusted to 20% while a solvent change from the pyridine to xylene was repeated three times by using a rotary evaporator, and the resultant was filtered with a 0.1 μm Teflon filter. About 100 g of dry pyridine was added to an inorganic polysilazane solution obtained through the foregoing step, and polymerization was performed at 100° C. at a solid content of 10% to provide a weight average molecular weight of 3,000. When the polymerization was complete, the solid content was adjusted to 20% while a solvent change to dibutylether was repeated four times by using a rotary evaporator at 70° C., and the resultant was filtered with a 0.1 μm Teflon filter to obtain a composition for forming a silica layer.

EXAMPLE 2

A 1 L reactor equipped with a stirrer and a temperature controller was internally charged with dry nitrogen. Subsequently, 800 g of dry pyridine was put in the reactor and was cooled down to −1° C. Then, 60 g of dichlorosilane was slowly injected thereinto over 65 minutes at a rate of 200 sccm. Then, the resultant was aged for 1 hour while being stirred, and 37 g of ammonia was slowly injected thereinto over 4 hours at a rate of 200 sccm. Then, the resultant was aged for 2 hours while being stirred. Dry nitrogen was injected into the reactor for 12 hours, and the ammonia remaining in the reactor was removed. A white slurry product obtained through the foregoing step was filtered with a 0.1 μm Teflon filter under a dry nitrogen atmosphere to obtain 680 g of a filtered solution. Then, 800 g of dry xylene was added thereto, a solid content was adjusted to 20% while a solvent change from the pyridine to xylene was repeated three times by using a rotary evaporator, and the resultant was filtered with a 0.1 μm Teflon filter. About 200 g of dry pyridine was added to an inorganic polysilazane solution obtained through the foregoing step, and polymerization was performed at 100° C. at a solid content of 5% to provide a weight average molecular weight of 3,000. When the polymerization is complete, a solid content was adjusted to 20% while a solvent change to dibutylether was repeated four times by using a rotary evaporator at 70° C., and the resultant was filtered with a 0.1 μm Teflon filter to obtain a composition for forming a silica layer.

COMPARATIVE EXAMPLE 1

A 1 L reactor equipped with a stirrer and a temperature controller was internally charged with dry nitrogen. Subsequently, 800 g of dry pyridine was put in the reactor and was cooled down to −1° C. Then, 60 g of dichlorosilane was slowly injected thereinto over 65 minutes at a rate of 200 sccm. Then, the resultant was aged for 1 hour while being stirred, and 29 g of ammonia was slowly injected thereinto over 195 minutes at a rate of 200 sccm. Then, the resultant was aged for 14 hours while being stirred. Dry nitrogen was injected into the reactor for 12 hours, and the ammonia remaining in the reactor was removed. A white slurry product obtained through the foregoing step was filtered with a 0.1 μm Teflon filter under a dry nitrogen atmosphere to obtain 680 g of a filtered solution. Then, 800 g of dry xylene was added thereto, a solid content was adjusted to 20% while a solvent change from the pyridine to xylene was repeated three times by using a rotary evaporator, and the resultant was filtered with a 0.1 μm Teflon filter. About 200 g of dry pyridine was added to an inorganic polysilazane solution obtained through the foregoing step, and polymerization was performed at 100° C. at a solid content of 5% to provide a weight average molecular weight of 3,000. When the polymerization is complete, a solid content was adjusted to 20% while a solvent change to dibutylether was repeated four times by using a rotary evaporator at 70° C., and the resultant was filtered with a 0.1 μm Teflon filter to obtain a composition for forming a silica layer.

COMPARATIVE EXAMPLE 2

A 1 L reactor equipped with a stirrer and a temperature controller was internally charged with dry nitrogen. Subsequently, 800 g of dry pyridine was put in the reactor and was cooled down to −1° C. Then, 60 g of dichlorosilane was slowly injected thereinto over 65 minutes at a rate of 200 sccm. Then, the resultant was aged for 1 hour while being stirred and was heated so that the reactor temperature may be 20° C. 29 g of ammonia was slowly injected thereinto over 195 minutes at a rate of 200 sccm. Then, the resultant was stirred at a temperature of 20° C. and aged for 14 hours. Dry nitrogen was injected into the reactor for 12 hours, and the ammonia remaining in the reactor was removed. A white slurry product obtained through the foregoing step was filtered with a 0.1 μm Teflon filter under a dry nitrogen atmosphere to obtain 680 g of a filtered solution. Then, 800 g of dry xylene was added thereto, a solid content was adjusted to 20% while a solvent change from the pyridine to xylene was repeated three times by using a rotary evaporator, and the resultant was filtered with a 0.1 μm Teflon filter. About 200 g of dry pyridine was added to an inorganic polysilazane solution obtained through the foregoing step, and polymerization was performed at 100° C. at a solid content of 5% to provide a weight average molecular weight of 3,000. When the polymerization is complete, a solid content was adjusted into 20% while a solvent change to dibutylether was repeated four times by using a rotary evaporator at 70° C., and the resultant was filtered with a 0.1 μm Teflon filter to obtain a composition for forming a silica layer.

FT-IR Analysis 3 cc of each of the compositions for forming a silica layer obtained according to Examples 1 and 2 and Comparative Examples 1 and 2 was taken and dropped in a center of an 8 inch wafer, spin-coated at 1500 rpm for 20 seconds with a spin-coater (MS-A200, MIKASA Co., Ltd.), and then, heated and dried at 150° C. for 80 seconds.

Subsequently, the dried composition was allowed to stand at 85° C. under humidity of 85% for 2 hours by using a thermo-hygrostat, and each area of an Si—O stretching (1000-1300 $cm^{-1}$) wave number and an Si—H stretching (2100-2285 $cm^{-1}$) wave number was measured by using FT-IR equipment (Tensor 27, Bruker) and used to calculate an area ratio of Si—O to Si—H (i.e., (an area of Si—O after being allowed to stand for 2 hours under the above condition)/(an area of Si—H after being allowed to stand for 2 hours).

Subsequently, a Si—O/Si—H area ratio, i.e., (an area of Si—O after being allowed to stand for 24 hours)/(an area of Si—H after being allowed to stand for 24 hours) was calculated according to the same method as above by using the FT-IR equipment after being allowed to stand for 24 hours.

A $SiO_2$ conversion rate was obtained through a slope of the digitized Si—O/Si—H ratio after respectively being allowed to stand for 2 hours and for 24 hours.

Table 1 shows an FT-IR-measured Si—O area and an FT-IR-measured Si—H area according to a time duration of being allowed to stand under the above temperature and humidity conditions, and Table 2 shows a relative Si—O/Si—H area ratio according to a time duration of being allowed to stand under the above temperature and humidity conditions.

TABLE 1

| | | Comparative Example 1 | Comparative Example 2 | Example 1 | Example 2 |
|---|---|---|---|---|---|
| Si—H | 2 hr | 13.571 | 12.808 | 15.021 | 15.612 |
| | 24 hr | 1.767 | 2.105 | 2.411 | 3.995 |
| Si—O | 2 hr | 0.380 | 0.454 | 0.479 | 0.269 |
| | 24 hr | 32.952 | 36.069 | 28.990 | 25.455 |

TABLE 2

| | | Comparative Example 1 | Comparative Example 2 | Example 1 | Example 2 |
|---|---|---|---|---|---|
| SiO/SiH | 2 hr | 0.028 | 0.035 | 0.032 | 0.017 |
| | 24 hr | 18.651 | 17.132 | 12.025 | 6.372 |

Table 3 shows $SiO_2$ conversion rates calculated by using the relative Si—O/Si—H area ratios depending time allowed to stand in Table 2. FIG. 1 is a graph showing a Si—O/Si—H area ratio (a relative value) of each composition for forming a silica layer according to Examples 1 and 2 and Comparative Examples 1 and 2 based on a time duration of being allowed to stand under. In FIG. 1, the 'a.u.' stands for absorbance units.

TABLE 3

|  | Comparative Example 1 | Comparative Example 2 | Example 1 | Example 2 |
| --- | --- | --- | --- | --- |
| SiO$_2$ conversion rate | 18.623 | 17.097 | 11.993 | 6.355 |

Referring to Table 3 and FIG. 1, the compositions for forming a silica layer according to Examples 1 and 2 showed a slope (a relative value) of a SiO/Si—H area ratio, that is, a SiO$_2$ conversion rate in a range of greater than 0 and less than or equal to 15. On the contrary, the compositions for forming a silica layer according to Comparative Examples 1 and 2 showed a slope of a Si—O/Si—H area ratio (a relative value), that is, a SiO$_2$ conversion rate of greater than 15.

Evaluation of Properties 3 cc of each composition for forming a silica layer according to Examples 1 and 2 and Comparative Examples 1 and 2 was dropped on a center of a wafer having a diameter of 8 inches by using a spin coater (MS-A200, MIKASA Co., Ltd.), spin-coated at 1,500 rpm for 20 seconds, and heated and dried at 150° C. for 80 seconds by using a hot plate. Then, thicknesses of the silica layers were measured by a reflection spectroscopic type film thickness meter (ST-4000, K-MAC Technology Corp.) and a reflection spectroscopic type wafer shrinkage meter FLX-2320-S, Toho Technology Inc.) and then, wet-cured at 600° C. for 30 minutes (VF-1000, Koyo thermal system). Then, their thicknesses were measured by using the reflection spectroscopic type film thickness meter again.

Layer shrinkage rates were calculated according to Equation 2 below.

Layer shrinkage rate (%)=(layer thickness before wet curing−layer thickness after wet curing)/(layer thickness before wet curing)×100%   [Equation 2]

Wet etch rate (WER) characteristics inside a gap were examined through an image of an interior of a gap in a pattern wafer by using an electron microscope (V-SEM). Herein, as a black area inside the gap is smaller in FIG. 3 than in FIG. 2, the wet etch rate (WER) characteristics of the example embodiment of FIG. 3 are excellent.

The property evaluation results are shown in Table 4 below.

TABLE 4

|  |  | Comparative Example 1 | Comparative Example 2 | Example 1 | Example 2 |
| --- | --- | --- | --- | --- | --- |
| Bare wafer | Shrinkage (%) | 16.32 | 16.04 | 15.04 | 13.30 |
| PTN wafer | WER in Gap | Bad | Bad | Good | Good |

Referring to above Table 4, a silica layer formed from each composition for forming a silica layer which has a SiO$_2$ conversion rate in a range of greater than 0 and less than or equal to 15 according to Examples 1 and 2 showed a lower layer shrinkage rate compared with a silica layer formed from each composition for forming a silica layer having a SiO$_2$ conversion rate in a range of greater than 15 according to Comparative Examples 1 and 2.

Figure 2:
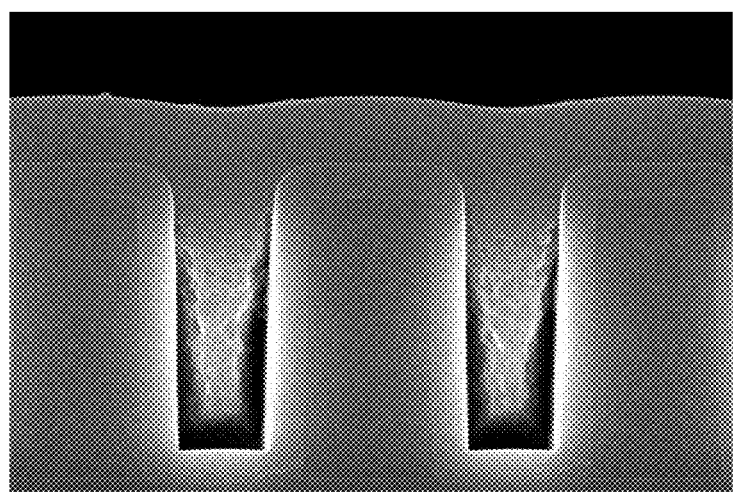
FIG. 2 is a V-SEM image inside a gap of a pattern wafer after wet-etching a silica layer formed of the composition for forming a silica layer according to Comparative Example 2, and FIG. 3 a V-SEM image inside a gap of a pattern wafer after wet-etching a silica layer formed of the composition for forming a silica layer according to Example 2.
Figure 3:
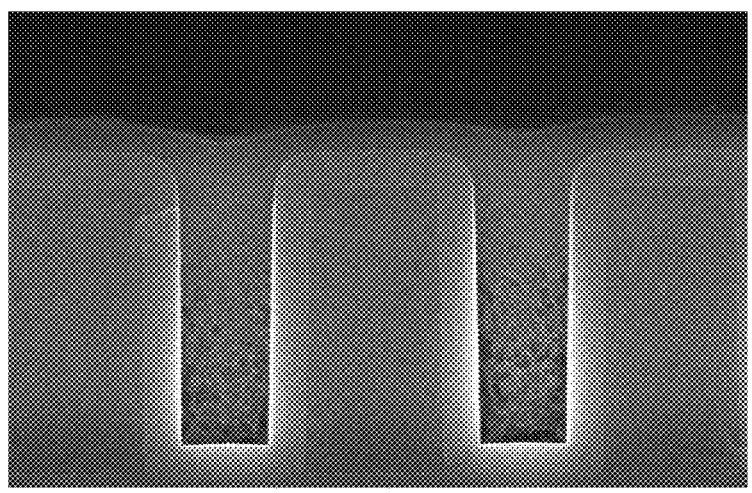

FIGS. 2 and 3 show V-SEM images inside a gap of a pattern wafer after wet etching the silica layers respectively formed from the compositions for forming a silica layer according to Comparative Example 2 and Example 2, respectively.

Referring to FIGS. 2 and 3, the silica layer formed of the composition for forming a silica layer according to Example 2 was more converted into an oxide layer than the silica layer formed from the composition for forming a silica layer according to Comparative Example 2.

While this inventive concept has been described in connection with what is presently considered to be practical example embodiments, it is to be understood that the inventive concept is not limited to the disclosed embodiments, and covers various modifications and equivalent arrangements included within the spirit and scope of the appended claims.

What is claimed is:

1. A composition for forming a silica layer, the composition comprising
   a silicon-containing polymer; and
   a solvent,
   wherein the composition has a SiO$_2$ conversion rate of greater than about 0 and less than or equal to about 15, and
   wherein the SiO$_2$ conversion rate is represented by:
   SiO$_2$ conversion rate=(a ratio of an FT-IR-measured area of an Si—O stretching wave number of 1000-1300 cm$^{-1}$ to an FT-IR-measured area of an Si—H stretching wave number of 2100-2285 cm$^{-1}$ measured after coating the composition in a thickness of 6700 Å on a bare wafer, and allowing the coated wafer to stand for 24 hours under conditions of a temperature of 85° C. and a relative humidity of 85%)−(a ratio of an FT-IR-measured area of Si—O stretching wave number to an FT-IR-measured area of the Si—H stretching wave number measured after coating the composition in a thickness of 6700 Å on a bare wafer, and allowing the coated wafer to stand for 2 hours under conditions of a temperature of 85° C. and a relative humidity of 85%).

2. The composition of claim 1, wherein the SiO$_2$ conversion rate is greater than or equal to about 1 and less than or equal to about 15.

3. The composition of claim 1, wherein the SiO$_2$ conversion rate is greater than or equal to about 5 and less than or equal to about 15.

4. The composition of claim 1, wherein the SiO$_2$ conversion rate is greater than or equal to about 6 and less than or equal to about 15.

5. The composition of claim 1, wherein the SiO$_2$ conversion rate is greater than or equal to about 6 and less than or equal to about 13.

6. The composition of claim 1, wherein the SiO$_2$ conversion rate is greater than or equal to about 6 and less than or equal to about 12.

7. The composition of claim 1, wherein the silicon-containing polymer is polysilazane, polysiloxazane, or a combination thereof.

8. The composition of claim 1, wherein the silicon-containing polymer is included in an amount of about 0.1 wt % to about 30 wt % based on a total amount of the composition for forming the silica layer.

9. The composition of claim 1, wherein the silicon-containing polymer comprises a moiety represented by following formula (1) or (2):

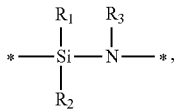
(1)

where each of $R_1$ to $R_3$ is independently hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C2 to C30 alkenyl group, a substituted or unsubstituted alkoxy group, a carboxyl group, an aldehyde group, a hydroxy group, or a combination thereof; and

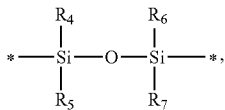
(2)

where each of $R_4$ to $R_7$ hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C2 to C30 alkenyl group, a substituted or unsubstituted alkoxy group, a carboxyl group, an aldehyde group, a hydroxy group, or a combination thereof.

10. The composition of claim 9, wherein the silicon-containing polymer further comprises a moiety represented by following formula (3):

(3).

11. The composition of claim 10, wherein the silicon-containing polymer is polysilazane, polysiloxazane, or a combination thereof, and
wherein the moiety represented by formula (3) is included in the silicon-containing polymer in an amount of about 15 to about 35 wt % based on a total amount of a Si—H bond in the polysilazane, the polysiloxazane, or the combination thereof.

12. The composition of claim 1, wherein the solvent comprises at least one selected from benzene, toluene, xylene, ethylbenzene, diethylbenzene, trimethylbenzene, triethylbenzene, cyclohexane, cyclohexene, decahydro naphthalene, dipentene, pentane, hexane, heptane, octane, nonane, decane, ethylcyclohexane, methylcyclohexane, cyclohexane, cyclohexene, p-menthane, dipropylether, dibutylether, anisole, butyl acetate, amyl acetate, methylisobutylketone, and a combination thereof.

13. A silica layer comprising a silica component obtained by curing the composition for forming the silica layer of claim 1.

14. The silica layer of claim 13, wherein a shrinkage rate of the silica layer ranges from about 13% to about 15.5%, and
wherein the shrinkage rate is represented by:

Layer shrinkage rate (%)=(layer thickness before wet curing−layer thickness after wet curing)/(layer thickness before wet curing)×100%, and wherein the wet curing is performed by heat treatment at about 600° C. for about 30 minutes.

15. An insulating layer comprising the silica layer of claim 13.

16. An electronic device comprising the silica layer of claim 13.

* * * * *